United States Patent
Lee

(10) Patent No.: US 8,101,123 B2
(45) Date of Patent: Jan. 24, 2012

(54) COMPOSITE ALLOY BONDING WIRE AND MANUFACTURING METHOD THEREOF

(76) Inventor: Jun-Der Lee, Tao-Yuan Hsieng (TW)

( * ) Notice: Subject to any disclaimer, the term of this patent is extended or adjusted under 35 U.S.C. 154(b) by 10 days.

(21) Appl. No.: 12/408,987

(22) Filed: Mar. 23, 2009

(65) Prior Publication Data
US 2010/0239456 A1    Sep. 23, 2010

(51) Int. Cl.
*C22C 5/06* (2006.01)
*C22F 1/00* (2006.01)
(52) U.S. Cl. ............... 420/505; 148/522; 72/274
(58) Field of Classification Search .......... 420/505; 148/522
See application file for complete search history.

(56) References Cited

U.S. PATENT DOCUMENTS
5,316,204 A * 5/1994 Takehashi et al. ......... 228/179.1
2004/0057864 A1 * 3/2004 Chang et al. ............... 420/503

FOREIGN PATENT DOCUMENTS
JP    2001176912 A * 6/2001
* cited by examiner

*Primary Examiner* — Emily Le
*Assistant Examiner* — Rebecca Lee
(74) *Attorney, Agent, or Firm* — Chun-Ming Shih; HDLS IPR Services

(57) ABSTRACT

A manufacturing method for a composite alloy bonding wire and products thereof. A primary material of Au and Ag is melted in a vacuum melting furnace, and then a secondary metal material of Pd is added into the vacuum melting furnace and is co-melted with the primary material to obtain a Au—Ag—Pd alloy solution. The obtained Au—Ag—Pd alloy solution is drawn to obtain a Au—Ag—Pd alloy wire. The Au—Ag—Pd alloy wire is then drawn to obtain a Au—Ag—Pd alloy bonding wire with a predetermined diameter.

2 Claims, 2 Drawing Sheets

COMPOSITE ALLOY BONDING WIRE AND MANUFACTURING METHOD THEREOF

BACKGROUND OF THE INVENTION

1. Field of the Invention

The present invention generally relates to a bonding wire used as a packaging wire, in particular, to a bonding wire used in semiconductor packaging process.

2. Description of Related Art

In semiconductor device packaging processes for IC, LED, SAW, a wire bonding process is often performed to electrically connect the chip to the substrate by bonding wire, which used as a signal and electrical current transmitting medium between the chip and the substrate.

The primary characteristics of a bonding wire, such as breaking load, elongation, loop, melting point, and bondability with IC chips are dependent on the materials used as the bonding wire. The performance of the packaged semiconductor device is influenced by the characteristics of the bonding wire. According to different types of chip and substrate, the adapted bonding wire has different specification.

The conventional bonding wires are usually made of pure Au material. Pure Au bonding wire has better physical properties, such as elongation and electrical conductivity. However, pure Au bonding wire inevitably leads to high cost.

Therefore, the subject of the present invention is to solve the above mentioned problem to provide a low cost bonding wire with performance comparable to pure Au bonding wire.

SUMMARY OF THE INVENTION

The subject of this invention is to provide a low cost composite alloy bonding wire made of Gold, silver and Palladium, capable of having performance as good as a pure Au bonding wire.

In order to obtain the above mentioned subject, a manufacturing method for a composite alloy bonding wire is disclosed. A primary metal material of Au and Ag is melted in a vacuum melting furnace, and then a secondary metal material of Pd is added into the vacuum melting furnace and is co-melted with the primary metal material to obtain a Au—Ag—Pd alloy solution. The obtained Au—Ag—Pd alloy solution is then cast and drawn to obtain a Au—Ag—Pd alloy wire. Finally, the obtained Au—Ag—Pd alloy wire is then drawn to obtain a Au—Ag—Pd alloy bonding wire with a predetermined diameter.

Besides, a composite alloy bonding wire made by the abovementioned manufacturing method is provided. The composite alloy bonding wire includes 8.00~30.00 wt. % Au, 66.00~90.00 wt. % Ag and 0.01~6.00 wt. % Pd.

The composite alloy bonding wire is capable of having performance as good as a pure Au bonding wire and decreasing the manufacturing cost.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

In cooperation with attached drawings, the technical contents and detailed description of the present invention are described thereinafter according to a preferable embodiment, being not used to limit its executing scope. Any equivalent variation and modification made according to appended claims is all covered by the claims claimed by the present invention.

Figure 1:
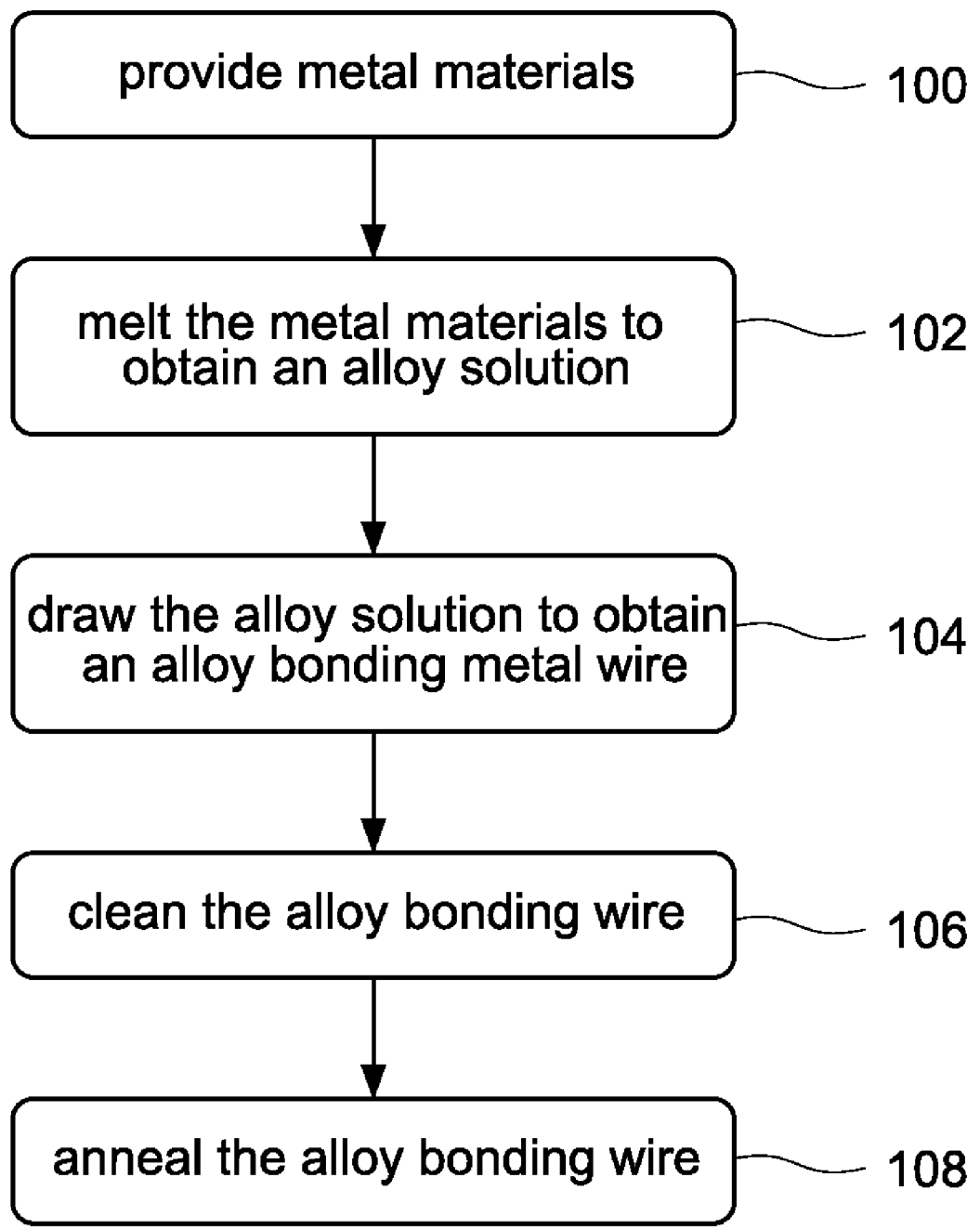
FIG. 1 is a flow chart for manufacturing composite alloy bonding wire of the present invention.
Figure 2:
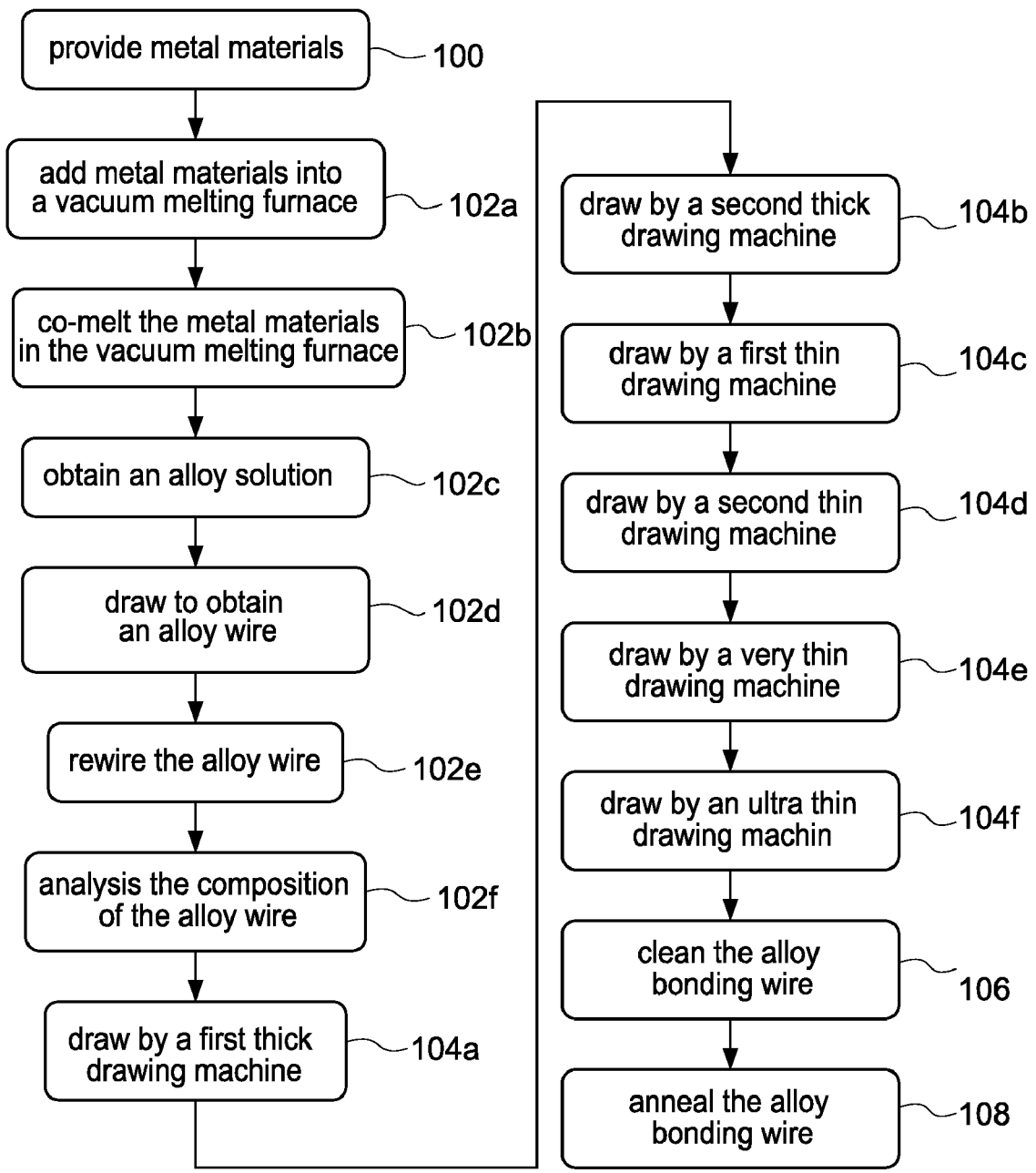
FIG. 2 shows detailed sub-steps in the flow chart of FIG. 1.

Refer to FIG. 1 and FIG. 2, which respectively are a flow chart for manufacturing composite alloy bonding wire of the present invention and a drawing showing detailed sub-steps in the flow chart of FIG. 1. Step 100, a primary material of Au and Ag is provided.

Step 102, the primary material is melted in a vacuum melting furnace (step 102a). Specific amount of a secondary metal material of Pd is added into the vacuum melting furnace (step 102b), and co-melted with the primary material in the vacuum melting furnace to obtain a Au—Ag—Pd alloy solution (step 102c). The Au—Ag—Pd alloy solution consists of 8.00~30.00 wt. % Au, 66.00~90.00 wt. % Ag and 0.01~6.00 wt. % Pd.

Subsequently, continuous casting and drawing processes are performed on the Au—Ag—Pd alloy solution to obtain a Au—Ag—Pd alloy wire with diameter of 4-8 mm (step 102d). The Au—Ag—Pd alloy wire is rewired by a reeling machine (step 102e) and then composition analysis (102f) is performed on the Au—Ag—Pd alloy wire to check if the obtained composition meets the requirement.

Step 104, a drawing process is performed on the Au—Ag—Pd alloy wire; the obtained Au—Ag—Pd alloy wire with a diameter of 4-8 mm is drawn by a first thick drawing machine to obtain a Au—Ag—Pd alloy wire with a diameter of 3 mm or smaller than 3 mm (step 104a). The Au—Ag—Pd alloy wire with a diameter of 3 mm or smaller than 3 mm is drawn by a second thick drawing machine to obtain a Au—Ag—Pd alloy wire with a predetermined diameter of 1 mm or smaller than 1 mm (step 104b). The Au—Ag—Pd alloy wire with diameter 1 mm or smaller than 1 mm is drawn by a first thin drawing machine to obtain a Au—Ag—Pd alloy wire with a diameter of 0.18 mm or smaller than 0.18 mm (step 104c). Then the Au—Ag—Pd alloy wire with a diameter of 0.18 mm or smaller than 0.18 mm is sequentially drawn by the second thin drawing machine (step 104d), a very thin drawing machine (step 104e) and an ultra thin drawing machine (step 104f) to obtain an ultra thin Au—Ag—Pd alloy bonding wire with a predetermined diameter of 0.050 mm (2.00 mil) to 0.010 mm (0.40 mil).

Step 106, the surface of the Au—Ag—Pd alloy bonding wire is cleaned.

Step 108, the Au—Ag—Pd alloy bonding wire is annealed to ensure a final product with desirable physical properties of breaking load and elongation.

The Au—Ag—Pd alloy bonding wire can be applied to packaging process of IC, LED and SAW.

The invention is more detailed described by three embodiments below:

Embodiment 1

A primary material of Au and Ag is provided and is melted in a vacuum melting furnace. Then, specific amount of a secondary metal material of Pd is added into the vacuum melting furnace, and is co-melted with the primary material in the vacuum melting furnace to obtain a Au—Ag—Pd alloy solution. The Au—Ag—Pd alloy solution consists of: 30.00 wt. % Au, 66.00 wt. % Ag and 4.00 wt. % Pd.

Continuous casting and drawing processes are performed on the Au—Ag—Pd alloy solution to obtain a Au—Ag—Pd alloy wire with a diameter of 4 mm. The Au—Ag—Pd alloy wire is rewired by a reeling machine and then composition analysis is performed on the Au—Ag—Pd alloy wire to check if the obtained composition meets the requirement.

A drawing process is performed on the Au—Ag—Pd alloy wire; the obtained Au—Ag—Pd alloy wire with a diameter of 4 mm is drawn by a first thick drawing machine to obtain a Au—Ag—Pd alloy wire with a diameter of 3 mm. The Au—Ag—Pd alloy wire with a diameter of 3 mm is drawn by a second thick drawing machine to obtain a Au—Ag—Pd alloy wire with a diameter of 1 mm. The Au—Ag—Pd alloy wire with a diameter of 1 mm is drawn by a first thin drawing machine to obtain a Au—Ag—Pd alloy wire with a diameter of 0.18 mm. Then the Au—Ag—Pd alloy wire with a diameter of 0.18 mm is sequentially drawn by the second thin drawing machine, a very thin drawing machine and an ultra thin drawing machine to obtain an ultra thin Au—Ag—Pd alloy bonding wire with a predetermined diameter of 0.050 mm to 0.010 mm.

Finally, the surface of Au—Ag—Pd alloy bonding wire is cleaned and is annealed.

Embodiment 2

A primary material of Au and Ag is provided and is melted in a vacuum melting furnace. Then, specific amount of a secondary metal material of Pd is added into the vacuum melting furnace, and is co-melted with the primary material in the vacuum melting furnace to obtain a Au—Ag—Pd alloy solution. The Au—Ag—Pd alloy solution consists of 8.00 wt. % Au, 86.00 wt. % Ag and 6.00 wt. % Pd.

Continuous casting and drawing processes are performed on the Au—Ag—Pd alloy solution to obtain a Au—Ag—Pd alloy wire with a diameter of 6 mm. The Au—Ag—Pd alloy wire is rewired by a reeling machine and then composition analysis is performed on the Au—Ag—Pd alloy wire to check if the obtained composition meets the requirement.

A drawing process is performed on the Au—Ag—Pd alloy wire; the obtained Au—Ag—Pd alloy wire with a diameter of 6 mm is drawn by a first thick drawing machine to obtain a Au—Ag—Pd alloy wire with a diameter of 3 mm. The Au—Ag—Pd alloy wire with a diameter of 3 mm is drawn by a second thick drawing machine to obtain a Au—Ag—Pd alloy wire with a diameter of 1.0 mm. The Au—Ag—Pd alloy wire with a diameter of 1.0 mm is drawn by a first thin drawing machine to obtain a Au—Ag—Pd alloy wire with a diameter of 0.18 mm. Then the Au—Ag—Pd alloy wire with a diameter of 0.18 mm is sequentially drawn by the second thin drawing machine, a very thin drawing machine and an ultra thin drawing machine to obtain an ultra thin Au—Ag—Pd alloy bonding wire with a predetermined diameter of 0.050 mm to 0.010 mm.

Finally, the surface of Au—Ag—Pd alloy bonding wire is cleaned and is annealed.

Embodiment 3

A primary material of Au and Ag is provided and is melted in a vacuum melting furnace. Then, specific amount of a secondary metal material of Pd is added into the vacuum melting furnace, and is co-melted with the primary material in the vacuum melting furnace to obtain a Au—Ag—Pd alloy solution. The Au—Ag—Pd alloy solution consists of 9.99 wt. % Au, 90.00 wt. % Ag and 0.01 wt. % Pd.

Continuous casting and drawing processes are performed on the Au—Ag—Pd solution to obtain a Au—Ag—Pd alloy wire with a diameter of 8 mm. The Au—Ag—Pd alloy wire is rewired by a reeling machine and then composition analysis is performed on the Au—Ag—Pd alloy wire to check if the obtained composition meets the requirement.

A drawing process is performed on the Au—Ag—Pd alloy wire; the obtained Au—Ag—Pd alloy wire with a diameter of 8 mm is drawn by a first thick drawing machine to obtain a Au—Ag—Pd alloy wire with a diameter of 2 mm. The Au—Ag—Pd alloy wire with a diameter of 2 mm is drawn by a second thick drawing machine to obtain a Au—Ag—Pd alloy wire with a diameter of 1.0 mm. The Au—Ag—Pd alloy wire with a diameter of 1.0 mm is drawn by a first thin drawing machine to obtain a Au—Ag—Pd alloy wire with a diameter of 0.18 mm. Then the Au—Ag—Pd alloy wire with a diameter of 0.18 mm is sequentially drawn by the second thin drawing machine, a very thin drawing machine and an ultra thin drawing machine to obtain an ultra thin Au—Ag—Pd alloy bonding wire with a predetermined diameter of 0.050 mm to 0.010 mm.

Finally, the surface of Au—Ag—Pd alloy bonding wire is cleaned and is annealed.

While the invention is described in by way of examples and in terms of preferred embodiments, it is to be understood that the invention is not limited thereto. On the contrary, the aim is to cover all modifications, alternatives and equivalents falling within the spirit and scope of the invention as defined by the appended claims.

What is claimed is:

1. An alloy bonding wire, comprising:
    8.00~30.00 wt. % Au;
    66.00~90.00 wt. % Ag; and
    0.01~6.00 wt. % Pd, wherein the Au, Ag and Pd are melted to obtain a Au—Ag—Pd alloy that excludes copper, Au, Ag and Pd are essentially uniformly distributed in the alloy bonding wire, continuous casting and drawing processes are performed on the Au—Ag—Pd alloy to obtain the alloy bonding wire.

2. The alloy bonding wire as claimed in claim 1, wherein the composite alloy is drawn to become an alloy bonding wire with a predetermined diameter in a range from 0.010 mm to 8 mm, and wherein the ratio of wt. % of Au to wt. % of Ag is more than 4/45, and less than 5/11.

\* \* \* \* \*